(12) United States Patent
Shimotsusa et al.

(10) Patent No.: US 9,029,967 B2
(45) Date of Patent: May 12, 2015

(54) SOLID-STATE IMAGE PICKUP DEVICE HAVING WAVEGUIDES IN LIGHT-RECEIVING AND LIGHT-SHIELDING AREAS

(75) Inventors: Mineo Shimotsusa, Machida (JP); Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/362,649

(22) Filed: Jan. 31, 2012

(65) Prior Publication Data
US 2012/0199927 A1 Aug. 9, 2012

(30) Foreign Application Priority Data

Feb. 9, 2011 (JP) ................................. 2011-026352

(51) Int. Cl.
*H01L 31/0232* (2014.01)
*H01L 27/146* (2006.01)

(52) U.S. Cl.
CPC .... *H01L 27/14629* (2013.01); *H01L 27/14623* (2013.01); *H01L 27/14636* (2013.01); *H01L 27/14685* (2013.01)

(58) Field of Classification Search
CPC .................... H01L 27/14629; H01L 27/14623
USPC ..................... 257/432, 436; 438/69
See application file for complete search history.

(56) References Cited

U.S. PATENT DOCUMENTS

| 2004/0238908 | A1 | 12/2004 | Hashimoto | |
| 2006/0115230 | A1* | 6/2006 | Komoguchi et al. | 385/146 |
| 2008/0251874 | A1* | 10/2008 | Ishibe | 257/432 |
| 2008/0317423 | A1* | 12/2008 | Stepanov et al. | 385/132 |
| 2009/0166783 | A1 | 7/2009 | Maruyama | |
| 2009/0251573 | A1 | 10/2009 | Toyoda | |
| 2009/0286346 | A1 | 11/2009 | Adkisson | |
| 2012/0012961 | A1* | 1/2012 | Kataoka et al. | 257/432 |
| 2012/0038814 | A1* | 2/2012 | Tayanaka | 348/340 |

FOREIGN PATENT DOCUMENTS

| EP | 948055 A2 | 10/1999 |
| JP | 2007-141873 A | 6/2007 |
| JP | 2007-201091 A | 8/2007 |
| JP | 2008-177221 A | 7/2008 |
| JP | 2009-111225 A | 5/2009 |
| JP | 2010-098330 A | 4/2010 |
| JP | 2010-238726 A | 10/2010 |
| WO | 2010/113634 A | 10/2010 |
| WO | 2010/113634 A1 | 10/2010 |

* cited by examiner

*Primary Examiner* — Kevin Parendo

(74) *Attorney, Agent, or Firm* — Canon USA, Inc. IP Division

(57) ABSTRACT

A solid-state image pickup device includes a semiconductor substrate in which photoelectric conversion units are arranged. An insulator is disposed on the semiconductor substrate. The insulator has holes associated with the respective photoelectric conversion units. Members are arranged in the respective holes. A light-shielding member is disposed on the opposite side of one of the members from the semiconductor substrate, such that only the associated photoelectric conversion unit is shielded from light. In the solid-state image pickup device, the holes are simultaneously formed and the members are simultaneously formed.

19 Claims, 6 Drawing Sheets

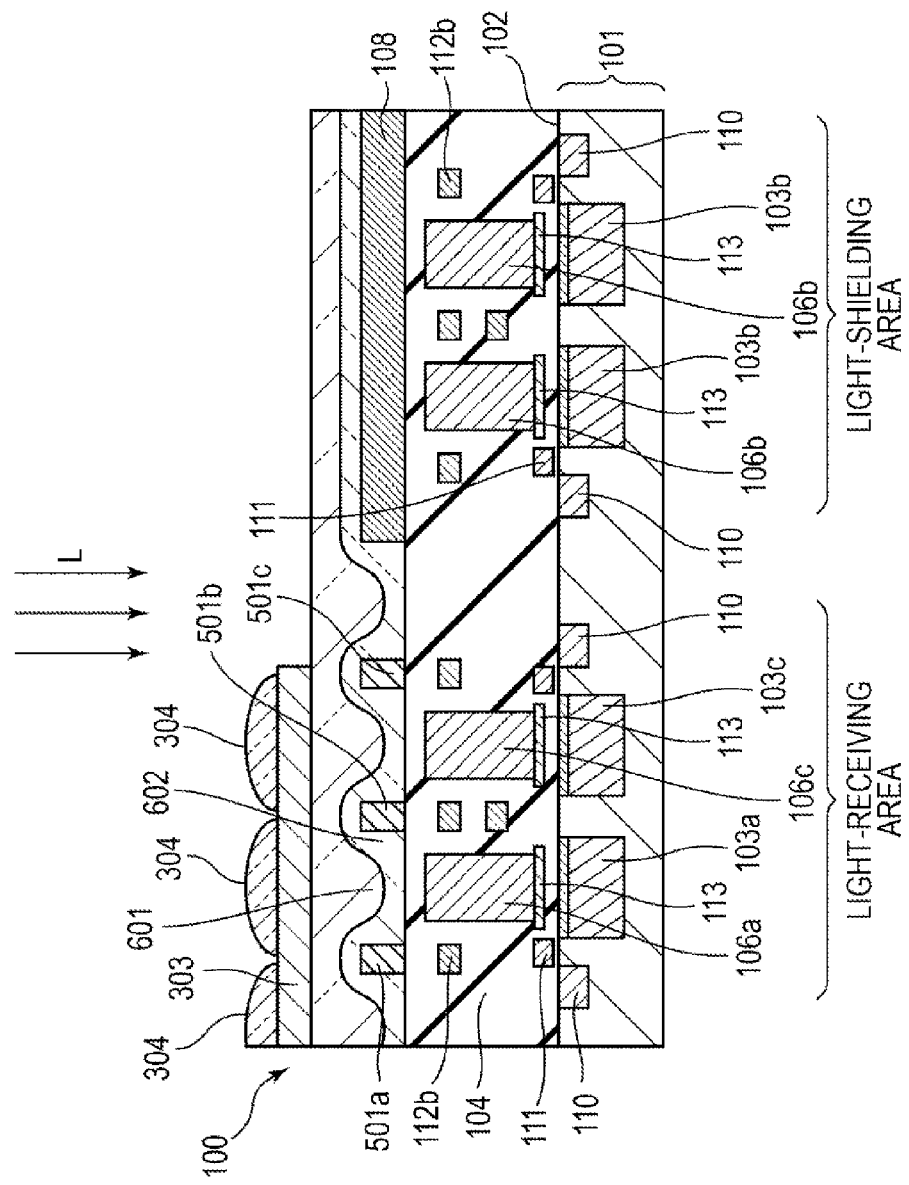

SOLID-STATE IMAGE PICKUP DEVICE HAVING WAVEGUIDES IN LIGHT-RECEIVING AND LIGHT-SHIELDING AREAS

BACKGROUND OF THE INVENTION

1. Field of the Invention

The present invention relates to a solid-state image pickup device and a method of making the same.

2. Description of the Related Art

Solid-state image pickup devices have recently been proposed which include an optical waveguide in order to increase the quantity of light incident on a photoelectric conversion unit.

Japanese Patent Laid-Open No. 2007-141873 discloses a solid-state image pickup device having a light-receiving area where pixels receiving light from a subject are arranged and a light-shielding area where light-shielded pixels are arranged. In the solid-state image pickup device illustrated in FIG. 1 disclosed in Japanese Patent Laid-Open No. 2007-141873, a first high refractive index region, serving as an optical waveguide, is disposed just above a first photoelectric conversion unit positioned in the light-receiving area. A second high refractive index region is disposed between a second photoelectric conversion unit positioned in the light-shielding area and a first interconnect disposed so as to cover the second photoelectric conversion unit.

The solid-state image pickup device disclosed in Japanese Patent Laid-Open No. 2007-141873 has the following disadvantages. First, the magnitude of dark current of each pixel in the light-receiving area may differ from that of each pixel in the light-shielding area. The reason is that the structure of the optical waveguide of each pixel in the light-receiving area markedly differs from that in the light-shielding area. Specifically, the upper surface of the first high refractive index region, serving as the optical waveguide of the pixel in the light-receiving area, differs from that of the second high refractive index region, serving as an optical waveguide of the pixel in the light-shielding region, in the level relative to a semiconductor substrate as illustrated in FIG. 1 of Japanese Patent Laid-Open No. 2007-141873. Accordingly, those regions differ from each other in the cross-sectional area.

Second, the parasitic capacitance of an interconnect for signal transmission of each pixel in the light-receiving area may differ from that of each pixel in the light-shielding area. The reason is that the structures of interconnects in the light-receiving area markedly differ from those in the light-shielding area. Specifically, the structure of a first interconnect closest to the semiconductor substrate in the light-receiving area differs from that in the light-shielding area.

Third, the extent of damage caused by a making process in the light-receiving area may differ from that in the light-shielding area. The reason is that a process of forming the optical waveguide of each pixel in the light-receiving area differs from that in the light-shielding area.

The above-described first to third disadvantages may increase the difference in noise between pixels in the light-receiving area and pixels in the light-shielding area.

SUMMARY OF THE INVENTION

The present invention provides a solid-state image pickup device including a semiconductor substrate, a first photoelectric conversion unit and a second photoelectric conversion unit arranged in the semiconductor substrate, a first member disposed on the semiconductor substrate, a second member disposed on the semiconductor substrate so as to overlap the first photoelectric conversion unit, a third member disposed on the semiconductor substrate so as to overlap the second photoelectric conversion unit, a plurality of interconnect layers arranged on the semiconductor substrate, and a light-shielding member disposed on an opposite side of the third member from the semiconductor substrate, the light-shielding member being configured to block at least part of light entering the second photoelectric conversion unit. The first member includes a first portion and a second portion, and both of the first and second portions do not overlap the first photoelectric conversion unit. The second member is disposed between the first and second portions. The first member includes a third portion and a fourth portion, and both of the third and fourth region do not overlap the second photoelectric conversion unit. The third member is disposed between the third and fourth portions. A first distance between the semiconductor substrate and an opposite surface of the second member from the semiconductor substrate and a second distance between the semiconductor substrate and an opposite surface of the third member from the semiconductor substrate are less than a third distance between the semiconductor substrate and the light-shielding member. The first distance and the second distance are greater than a fourth distance between the semiconductor substrate and an opposite surface of a conductive member, included in the closest interconnect layer to the semiconductor substrate of the interconnect layers, from the semiconductor substrate.

The present invention further provides a solid-state image pickup device including a semiconductor substrate, a first photoelectric conversion unit and a second photoelectric conversion unit arranged in the semiconductor substrate, a first member disposed on the semiconductor substrate, a second member disposed on the semiconductor substrate so as to overlap the first photoelectric conversion unit, a third member disposed on the semiconductor substrate so as to overlap the second photoelectric conversion unit, a plurality of interconnect layers arranged on the semiconductor substrate, and a light-shielding member disposed on an opposite side of the third member from the semiconductor substrate, the light-shielding member being configured to block at least part of light entering the second photoelectric conversion unit. The first photoelectric conversion unit and the second member are arranged in line along a first direction. The first member includes a first portion and a second portion. The first portion, the second member, and the second portion are arranged in line along a second direction intersecting the first direction. The first member includes a third portion and a fourth portion. The third portion, the third member, and the fourth portion are arranged in line along a third direction intersecting the first direction. A first distance between the semiconductor substrate and an opposite surface of the second member from the semiconductor substrate and a second distance between the semiconductor substrate and the opposite surface of the third member from the semiconductor substrate are less than a third distance between the semiconductor substrate and the light-shielding member. The first distance and the second distance are greater than a fourth distance between the semiconductor substrate and an opposite surface of a conductive member, included in a closest interconnect layer to the semiconductor substrate of the interconnect layers, from the semiconductor substrate.

The present invention further provides a method of making a solid-state image pickup device, the method including forming a first insulator on a semiconductor substrate in which a first photoelectric conversion unit and a second photoelectric conversion unit are arranged. The method includes simultaneously removing a first portion and a second portion of the first insulator, the first portion being associated with the first photoelectric conversion unit, the second portion being different from the first portion and being associated with the second photoelectric conversion unit. The method includes simultaneously forming a first member and a second member such that the first member is positioned in a region where the first portion has been removed and the second member is positioned in a region where the second portion has been removed. The method includes forming, after the forming the first and second members, a light-shielding member configured to block at least part of light entering the second photoelectric conversion unit. The method includes forming, after the forming a light-shielding member, forming a second insulator. After the forming the second insulator, removing only one of a third portion and a fourth portion of the second insulator is not performed, the third portion being associated with the first photoelectric conversion unit, the fourth portion being associated with the second photoelectric conversion unit.

The present invention further provides a method of making a solid-state image pickup device, the method including forming a first etching stopper on a semiconductor substrate in which a first photoelectric conversion unit and a second photoelectric conversion unit are arranged such that the first etching stopper overlaps the first photoelectric conversion unit. The method includes forming a second etching stopper on the semiconductor substrate such that the second etching stopper overlaps the second photoelectric conversion unit. The method includes forming a first insulator on the semiconductor substrate and the first and second etching stoppers. The method includes simultaneously etching a first portion and a second portion of the first insulator, the first portion being positioned on the first etching stopper, the second portion being different from the first portion and being positioned on the second etching stopper. The method includes simultaneously forming a first member and a second member such that the first member is positioned in a region where the first portion has been removed by etching and the second member is positioned in a region where the second portion has been removed by etching. The method includes forming, after the forming the first and second members, a light-shielding member configured to block at least part of light entering the second photoelectric conversion unit. And the method includes forming, after the forming the light-shielding member, a second insulator. After the forming the second insulator, removing only one of a third portion and a fourth portion of the second insulator is not performed, the third portion being associated with the first photoelectric conversion unit, the fourth portion being associated with the second photoelectric conversion unit. An etching rate of the first and second etching stoppers is lower than that of the first insulator. The first insulator is etched such that at least the first and second etching stoppers are exposed.

Further features of the present invention will become apparent from the following description of exemplary embodiments with reference to the attached drawings.

BRIEF DESCRIPTION OF THE DRAWINGS

FIG. 6 is a cross-sectional view of a schematic structure of a solid-state image pickup device according to a third embodiment.

DESCRIPTION OF THE EMBODIMENTS

Figure 1:
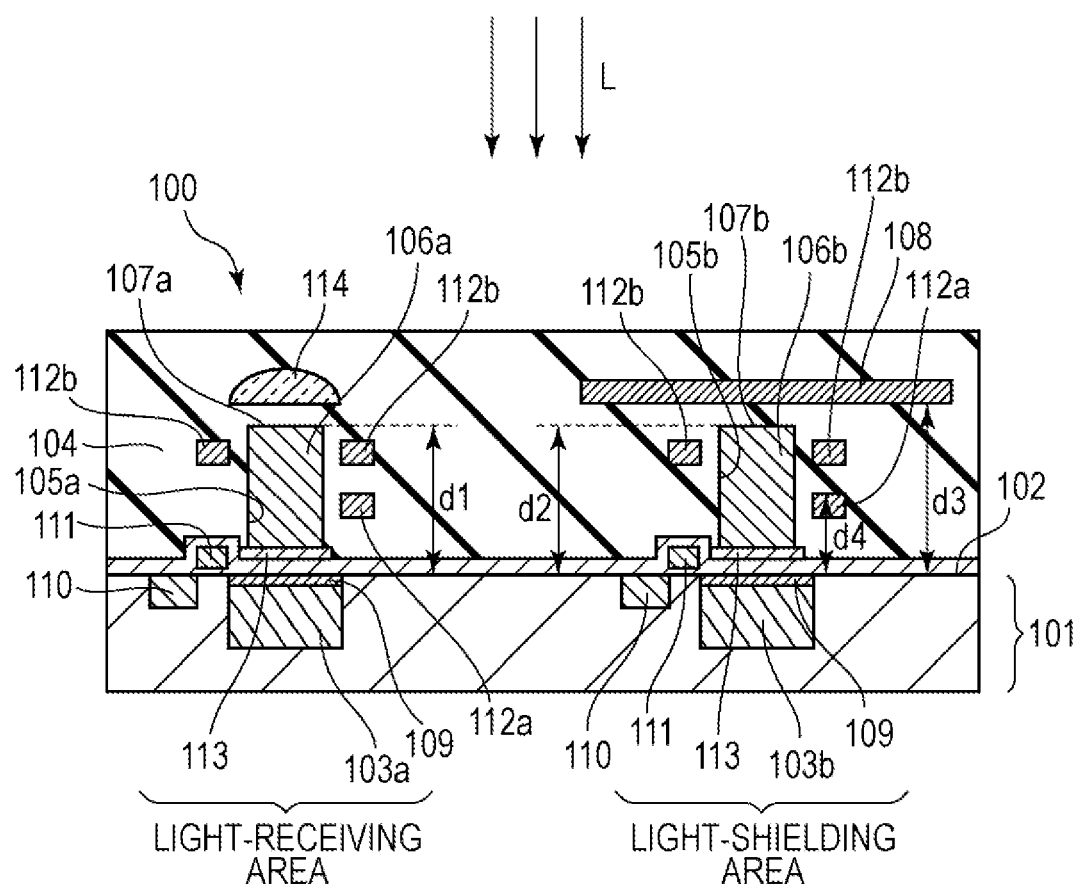
FIG. 1 is a cross-sectional view of a schematic structure of a solid-state image pickup device according to a first embodiment.

A solid-state image pickup device 100 according to the present invention includes a semiconductor substrate 101. The semiconductor substrate 101 is a semiconductor component of components constituting the solid-state image pickup device 100. Examples of the semiconductor substrate 101 include a semiconductor substrate made by forming semiconductor regions in a semiconductor wafer using a known semiconductor making process. Examples of a semiconductor material include silicon. The interface between the semiconductor material and another material is a principal surface 102 of the semiconductor substrate 101. The other material is, for example, a thermally-oxidized film disposed on the semiconductor substrate 101 in contact therewith. In FIG. 1, arrows L denote a direction of incidence of light. The light impinges on the principal surface 102 and enters the semiconductor substrate 101.

In this specification, the term "plan" means a plane parallel to the principal surface 102. For example, the principal surface 102 in a region where a photoelectric conversion unit, which will be described later, is disposed, or the principal surface 102 in a channel of a MOS transistor may be used as a reference. In this specification, the term "cross section" means a plane vertical to the "plan".

The semiconductor substrate 101 includes a photoelectric conversion unit 103a and a photoelectric conversion unit 103b. Light from a subject enters the photoelectric conversion unit 103a positioned in a light-receiving area (effective pixel area). Accordingly, a signal from the photoelectric conversion unit 103a can be processed as a pixel signal of a captured image. The photoelectric conversion unit 103b positioned in a light-shielding area (optical black area) is shielded from light. Accordingly, a signal from the photoelectric conversion unit 103b can be processed as a black level reference signal. Note that as long as electrons in the photoelectric conversion unit 103b can be read as signals, photoelectric conversion is not necessarily needed in the photoelectric conversion unit 103b.

An insulator 104 is disposed on the principal surface 102 of the semiconductor substrate 101. A component that comprises a conductive material may be disposed instead of the insulator 104. The insulator 104 has a hole 105a associated with the photoelectric conversion unit 103a and a hole 105b associated with the photoelectric conversion unit 103b. As regards the shape of each hole in cross section, the holes 105a and 105b do not have to completely pass through the insulator 104. The insulator 104 may have depressions instead of the respective holes 105a and 105b. As regards the shape of each hole in plan, the hole is shaped in a closed loop, for example, circular or rectangular. Alternatively, the hole may be a groove extending over a plurality of photoelectric conversion units, as viewed in plan. In this specification, the insulator 104 can be regarded as having a hole so long as a first region where the insulator 104 is not disposed is surrounded by a second region where the insulator 104 is disposed, or the first region is sandwiched by the second regions in a certain plane.

As regards the position of the hole 105a in plan, the hole 105a is disposed such that at least part of the hole 105a overlaps the photoelectric conversion unit 103a. Specifically, in the case where the hole 105a and the photoelectric conversion unit 103a are projected on the same plane, this plane has an area where both the hole 105a and the photoelectric conversion unit 103a are projected. As regards the position of the hole 105b in plan, the hole 105b is disposed such that at least part of the hole 105b overlaps the photoelectric conversion unit 103b.

A waveguide member 106a is disposed in the hole 105a. The hole 105a can be filled with the waveguide member 106a. The waveguide member 106a may, however, be omitted in part of the hole 105a. A waveguide member 106b is disposed in the hole 105b. The hole 105b can be filled with the waveguide member 106b. The waveguide member 106b may, however, be omitted in part of the hole 105b. Consequently, the waveguide member 106a is disposed such that at least part of the waveguide member 106a overlaps the photoelectric conversion unit 103a. In addition, the waveguide member 106b is disposed such that at least part of the waveguide member 106b overlaps the photoelectric conversion unit 103b.

The positional relationship between the insulator 104 and the waveguide members 106a and 106b will now be described. In a certain plane, a region where the waveguide member 106a is disposed is surrounded by the second region where the insulator 104 is disposed, alternatively, the region is sandwiched by the second regions. In a certain plane, a region where the waveguide member 106b is disposed is surrounded by the second region where the insulator 104 is disposed, alternatively, the region is sandwiched by the second regions. In other words, a first portion of the insulator 104, a second portion thereof different from the first portion, and the waveguide member 106a are arranged in line along a direction intersecting the direction in which the photoelectric conversion unit 103a and the waveguide member 106a are arranged in line. The direction intersecting the direction in which the photoelectric conversion unit 103a and the waveguide member 106a are arranged in line is parallel to, for example, the principal surface 102 of the semiconductor substrate 101. Furthermore, a third portion of the insulator 104, a fourth portion thereof different from the third portion, and the waveguide member 106b are arranged in line along a direction intersecting the direction in which the photoelectric conversion unit 103b and the waveguide member 106b are arranged in line. The direction intersecting the direction in which the photoelectric conversion unit 103b and the waveguide member 106b are arranged in line is parallel to, for example, the principal surface 102 of the semiconductor substrate 101.

In another aspect, such a structure will be described as follows. The insulator 104 includes the first portion and the second portion which do not overlap the photoelectric conversion unit 103a and the waveguide member 106a is disposed between the first and second portions. The insulator 104 includes the third portion and the fourth portion which do not overlap the photoelectric conversion unit 103b and the waveguide member 106b is disposed between the third and fourth portions.

A material of the waveguide member 106a is different from that of the insulator 104. A material of the waveguide member 106b is different from that of the insulator 104. The waveguide members 106a and 106b can comprise the same material. A dielectric constant of the material of the waveguide members 106a and 106b may be higher than that of the insulator 104.

A refractive index of the material of the waveguide members 106a and 106b can be higher than that of the insulator 104. According to the above relationship between the refractive indices, the interface between the waveguide member 106a and the insulator 104 can refract light entering the waveguide member 106a toward the photoelectric conversion unit 103a. In other words, the quantity of leakage light, which leaks into the insulator 104, of the light entering the waveguide member 106a can be reduced. Accordingly, so long as at least part of the waveguide member 106a overlaps the photoelectric conversion unit 103a, the quantity of light entering the photoelectric conversion unit 103a can be increased.

It is not necessary that the refractive index of the waveguide members 106a and 106b be higher than that of the insulator 104. So long as a structure is made such that light entering a predetermined region does not leak into the surrounding insulator, the structure functions as an optical waveguide. For example, a reflective member that reflects light may be disposed on a side wall of the hole 105a and a transparent member that is transmissive to light may be disposed on the other portion of the hole 105a. In this case, the refractive index of the transparent member and that of the surrounding insulator 104 may have any relationship therebetween. In this case, the reflective member comprises a material different from that of the surrounding insulator 104. According to a modification, an air gap may be disposed between the waveguide member 106a and the insulator 104. In this case, the air gap may be included in a first member.

A light-shielding member 108 is disposed on an opposite side of the waveguide member 106b from the semiconductor substrate 101. The light-shielding member 108 blocks most or all of the light traveling toward the photoelectric conversion unit 103b. In the case where the whole surfaces of the solid-state image pickup device 100 is irradiated with a uniform quantity of light, the light-shielding member 108 permits the quantity of light entering the photoelectric conversion unit 103b to be lower than that of light entering the photoelectric conversion unit 103a. For example, the light-shielding member 108 is metal disposed over the photoelectric conversion unit 103b. The light-shielding member 108 may be metal disposed over the light-shielding area including the photoelectric conversion unit 103b. The placement of the light-shielding member 108 on the opposite side of the waveguide member 106b from the semiconductor substrate 101 means that the waveguide member 106b is disposed between the semiconductor substrate 101 and the light-shielding member 108.

A first interconnect layer 112a and a second interconnect layer 112b are arranged adjacent to the principal surface 102 of the semiconductor substrate 101. The first interconnect layer 112a, the second interconnect layer 112b, and an interconnect layer including the light-shielding member 108 constitute a multilayer interconnect structure. The distance between the first interconnect layer 112a and the principal surface 102, the distance between the second interconnect layer 112b and the principal surface 102, and the distance between the interconnect layer including the light-shielding member 108 and the principal surface 102 differ from one another. The first interconnect layer 112a is the closest interconnect layer to the semiconductor substrate 101. The first interconnect layer 112a and the second interconnect layer 112b each include a conductive member. Each conductive member is shaped in a predetermined pattern and serves as interconnects. The interconnect layer including the light-shielding member 108 may include only the light-shielding member 108. Alternatively, the interconnect layer including the light-shielding member 108 may include a conductive member other than the light-shielding member 108. The multilayer interconnect structure in the present invention may include either one of the first and second interconnect layers 112a and 112b and the interconnect layer including the light-shielding member 108.

A feature of one aspect of the present invention is the positional relationship in cross section between the waveguide members 106a and 106b, the light-shielding member 108, and the conductive member included in the first interconnect layer 112a.

Let d1 denote the distance between the principal surface 102 and an opposite surface 107a of the waveguide member 106a from the semiconductor substrate 101. Let d2 denote the distance between the principal surface 102 and an opposite surface of the waveguide member 106b from the semiconductor substrate 101. Let d3 denote the distance between the principal surface 102 and the surface of the light-shielding member 108 facing the semiconductor substrate 101. Let d4 denote the distance between the principal surface 102 and an opposite surface of the conductive member, included in the first interconnect layer 112a, from the semiconductor substrate 101. The distance d1 and the distance d2 are less than the distance d3. The distance d1 and the distance d2 are greater than the distance d4.

In this arrangement, the opposite surfaces of the waveguide members 106a and 106b from the semiconductor substrate 101 are positioned at a level between the first interconnect layer 112a and the light-shielding member 108. Accordingly, the waveguide member 106a disposed in the hole 105a and the waveguide member 106b disposed in the hole 105b can be permitted to have substantially the same structure. In other words, an optical waveguide associated with the photoelectric conversion unit 103a in the light-receiving area and an optical waveguide associated with the photoelectric conversion unit 103b in the light-shielding area can be permitted to have substantially the same structure.

A feature of another aspect of the present invention is simultaneous formation of the holes 105a and 105b in the insulator 104 and simultaneous formation of the waveguide members 106a and 106b. In this specification, the simultaneous formation of the holes 105a and 105b means that a semiconductor process is performed not only to form one hole but also to form the other hole at the same time. The simultaneous formation of the waveguide members 106a and 106b means that a semiconductor process is performed not only to form one waveguide member but also to form the other waveguide member at the same time. Examples of the semiconductor process include layer deposition, etching, polishing, chemical mechanical planarization (CMP), cleaning, heat treatment, and ion implantation.

After the simultaneous formation of the waveguide members 106a and 106b, the light-shielding member 108 is formed. As regards an insulator formed after the formation of the light-shielding member 108, removing only one of a portion associated with a first photoelectric conversion unit and another portion associated with a second photoelectric conversion unit is not performed.

As described above, since the waveguide members 106a and 106b are formed by the same process, the extent of damage caused by the process on one waveguide member and that on the other waveguide member can be equalized. Consequently, the difference between noise caused in the photoelectric conversion unit 103a in the light-receiving area and that in the photoelectric conversion unit 103b in the light-shielding area can be reduced.

The simultaneous formation of the holes 105a and 105b may permit the holes 105a and 105b in the insulator 104 to have substantially the same structure. In addition, the simultaneous formation of the waveguide members 106a and 106b may permit the waveguide member 106a disposed in the hole 105a and the waveguide member 106b disposed in the hole 105b to have substantially the same structure. In other words, the optical waveguide associated with the photoelectric conversion unit 103a in the light-receiving area and the optical waveguide associated with the photoelectric conversion unit 103b in the light-shielding area can be permitted to have substantially the same structure.

Specific embodiments of the present invention will be described below. The present invention is not limited to specific components in the embodiments and appropriate modifications and variations may be made without departing from the spirit and concept of the present invention.

First Embodiment

A solid-state image pickup device according to a first embodiment of the present invention will be described with reference to the drawings. FIG. 1 is a cross-sectional view of a schematic structure of the solid-state image pickup device, indicated at 100, according to this embodiment. In this embodiment, a single pixel is illustrated in the light-receiving area and a single pixel is illustrated in the light-shielding area. In actual, a plurality of pixels are arranged in matrix in the light-receiving area. In addition, a plurality of pixels are arranged in the light-shielding area. In the following description, it is assumed that electrons are signal carriers. Holes may be signal carriers. In the case where holes serve as signal carriers, the conduction types of semiconductor regions may be reversed.

In this embodiment, a semiconductor substrate 101 is an n-type epitaxial layer. In the semiconductor substrate 101, p-type semiconductor regions and n-type semiconductor regions are arranged. The semiconductor substrate 101 has a principal surface 102. In this embodiment, the principal surface 102 is the interface between the semiconductor substrate 101 and a thermally-oxidized film (not illustrated) laminated on the semiconductor substrate 101. Light passes through the principal surface 102 and enters the semiconductor substrate 101. The arrows L denote the direction of incidence of light.

Photoelectric conversion units 103a and 103b are photodiodes, for example. In this embodiment, the photoelectric conversion units 103a and 103b each include an n-type semiconductor region constituting the photodiode. Carriers caused by photoelectric conversion are collected in the n-type semiconductor region. Each p-type semiconductor region 109 is disposed in contact with the principal surface 102 of the semiconductor substrate 101. The area of the photoelectric conversion unit 103a may be different from that of the photoelectric conversion unit 103b. Furthermore, the photoelectric conversion unit 103b may include no n-type semiconductor region. The photoelectric conversion unit 103b is shielded from light, such that a signal from the photoelectric conversion unit 103b may be used as a black level reference signal. In this case, since it is unnecessary to collect carriers caused by photoelectric conversion, the photoelectric conversion unit 103b may include no n-type semiconductor region. In addition, so long as electrons in the photoelectric conversion unit 103b can be read as signals, photoelectric conversion is not necessarily needed in the photoelectric conversion unit 103b.

Each floating diffusion (FD) region 110 is an n-type semiconductor region. Carries generated in each photoelectric conversion unit 103 is transferred to the corresponding FD region 110 and is converted into a voltage. The FD region 110 is electrically connected to an input node of an amplifying unit (not illustrated). Alternatively, the FD region 110 may be electrically connected to a signal output line (not illustrated). Each gate electrode 111 is disposed above the semiconductor substrate 101, with the thermally-oxidized film (not illustrated) therebetween. The gate electrodes 111 control carrier transfer between the photoelectric conversion unit 103a and the corresponding FD region 110 and that between the photoelectric conversion unit 103b and the corresponding FD region 110, respectively.

An insulator 104 is disposed adjacent to the principal surface 102 of the semiconductor substrate 101. In this embodiment, the insulator 104 is a silicon oxide film. A refractive index of the insulator 104 may be in the range of 1.40 to 1.60. A first interconnect layer 112a and a second interconnect layer 112b are arranged adjacent to the principal surface 102 of the semiconductor substrate 101. The first and second interconnect layers 112a and 112b are arranged at different levels relative to the principal surface 102 of the semiconductor substrate 101. In this embodiment, the conductive members of the first and second interconnect layers 112a and 112b comprise copper. The conductive members may comprise a conductive material other than copper. Part of the conductive member of the first interconnect layer 112a and part of the conductive member of the second interconnect layer 112b may be electrically connected to each other through a plug (not illustrated). The conductive members, excluding the parts electrically connected through the plug, of the first and second interconnect layers 112a and 112b are isolated from each other by the insulator 104. In other words, the insulator 104 may include an insulating interlayer. The number of interconnect layers is not limited to two. A single interconnect layer or three or more interconnect layers may be arranged.

In this embodiment, the pixel in the light-receiving area and the pixel in the light-shielding area have the same pattern of the conductive member included in the first interconnect layer 112a or the second interconnect layer 112b. The pixels in these areas have the same pattern of the conductive member included in at least the first interconnect layer 112a. As regards a range of the same pattern, the same pattern may be a conductive pattern of at least a portion constituting an electrical node up to the signal output line disposed on the rear of each pixel.

A hole 105a and a hole 105b are arranged in the insulator 104. The hole 105a is associated with the photoelectric conversion unit 103a. The hole 105b is associated with the photoelectric conversion unit 103b. A waveguide member 106a is disposed in the hole 105a. A waveguide member 106b is disposed in the hole 105b. In this embodiment, each of the waveguide members 106a and 106b is a silicon nitride film. Alternatively, each of the waveguide members 106a and 106b may be a silicon oxynitride film or comprise an organic material (resin, such as polyimide polymer). In this embodiment, a refractive index of the waveguide members 106a and 106b is higher than that of the insulator 104. The refractive index of the waveguide members 106a and 106b may be greater than or equal to 1.60. The refractive index thereof may be in the range of 1.80 to 2.40. In this embodiment, the hole 105a is filled with the waveguide member 106a. The waveguide member 106a may, however, be disposed in only part of the hole 105a. The waveguide member 106a may comprise a plurality of materials. In this case, the refractive index of any one of the materials may be higher than that of the insulator 104. For example, the waveguide member 106a may include a silicon nitride film and a silicon oxynitride film. Alternatively, a silicon nitride film may be disposed on the side wall of the hole 105a and in the vicinity of the bottom thereof and an organic material may be disposed in the other portion of the hole 105a. The description about the hole 105a and the waveguide member 106a can be applied to the hole 105b and the waveguide member 106b unless otherwise noted.

An etching stopper 113 is disposed between the semiconductor substrate 101 and each of the waveguide members 106a and 106b. The etching stopper 113 is a layer to accurately stop etching in the formation of the holes 105a and 105b. Alternatively, the etching stopper 113 may be a layer to delay etching. The etching stoppers 113 are in contact with the waveguide members 106a and 106b, respectively. In another aspect, the etching stoppers 113 serve as the bottoms of the holes 105a and 105b adjacent to the semiconductor substrate 101. Each etching stopper 113 comprises a material different from that of the insulator 104. In this embodiment, the etching stopper 113 is a silicon nitride film. The etching stopper 113 may be omitted depending on etching conditions. Furthermore, after formation of the etching stoppers 113, the etching stoppers 113 may be removed in etching for forming the holes 105a and 105b.

A light-shielding member 108 comprises metal or an organic material that is not transmissive to light. The material of the light-shielding member 108 may exhibit a high reflectivity to light having a wavelength of 400 to 600 nm. In this embodiment, the light-shielding member 108 comprises aluminum. The light-shielding member 108 is disposed over the photoelectric conversion unit 103b. The light-shielding member 108 may be disposed over the light-shielding area. The light-shielding member 108 does not have to block the whole of light entering the photoelectric conversion unit 103b. For example, light obliquely traveling from a portion where the light-shielding member 108 is not disposed may enter the photoelectric conversion unit 103b after multiple reflections.

The light-shielding member 108 may be part of a conductive member included in a third interconnect layer. In other words, the light-shielding member 108 may serve as an interconnect for transmitting a power supply voltage or a signal. Although not illustrated in FIG. 1, the third interconnect layer including the light-shielding member 108 may include a conductive member which serves as pads or interconnects for peripheral circuits. The third interconnect layer where the light-shielding member 108 is disposed may include only the light-shielding member 108.

The positional relationship between the waveguide members 106a and 106b, the first and second interconnect layers 112a and 112b, and the light-shielding member 108 will now be described. Referring to FIG. 1, d1 denotes the distance (first distance) between the principal surface 102 of the semiconductor substrate 101 and an opposite surface 107a of the waveguide member 106a from the semiconductor substrate 101. In FIG. 1, d2 denotes the distance (second distance) between the principal surface 102 of the semiconductor substrate 101 and an opposite surface 107b of the waveguide member 106b from the semiconductor substrate 101. In FIG. 1, d3 denotes the distance (third distance) between the principal surface 102 of the semiconductor substrate 101 and the light-shielding member 108. In FIG. 1, d4 denotes the distance (fourth distance) between the principal surface 102 of the semiconductor substrate 101 and an opposite surface of the conductive member, included in the first interconnect layer 112a, from the semiconductor substrate 101. As illustrated in FIG. 1, the distance 3 between the principal surface 102 and the light-shielding member 108 is greater than the distance d1 between the principal surface 102 and the opposite surface 107a of the waveguide member 106a from the semiconductor substrate 101 and the distance d2 between the principal surface 102 and the opposite surface 107b of the waveguide member 106b from the semiconductor substrate 101. In other words, the light-shielding member 108 is disposed farther from the semiconductor substrate 101 than the waveguide members 106a and 106b. The distance d1 between the principal surface 102 and the opposite surface 107a of the waveguide member 106a from the semiconductor substrate 101 and the distance d2 between the principal surface 102 and the opposite surface 107b of the waveguide member 106b from the semiconductor substrate 101 are greater than the distance d4. In other words, at least part of each of the waveguide members 106a and 106b is disposed farther from the semiconductor substrate 101 than the first interconnect layer 112a which is the closest to the semiconductor substrate 101.

In this embodiment, the distance d1 between the principal surface 102 and the opposite surface 107a of the waveguide member 106a from the semiconductor substrate 101 and the distance d2 between the principal surface 102 and the opposite surface 107b of the waveguide member 106b from the semiconductor substrate 101 are greater than the distance between the principal surface 102 and the opposite surface of the conductive member, included in the second interconnect layer 112b, from the semiconductor substrate 101. The distance d1 and the distance d2 are to be greater than at least the distance d4 between the principal surface 102 and the opposite surface of the conductive member, included in the interconnect layer closest to the semiconductor substrate 101, from the semiconductor substrate 101.

In this embodiment, the distance between the principal surface 102 and the surface of the waveguide member 106a facing the semiconductor substrate 101 and the distance between the principal surface 102 and the surface of the waveguide member 106b facing the semiconductor substrate 101 are less than the distance between the principal surface 102 and the surface of the conductive member, included in the first interconnect layer 112a, facing the semiconductor substrate 101. The arrangement is not limited to the above-described one. For example, the distance between the principal surface 102 and the surface of the waveguide member 106a facing the semiconductor substrate 101 and the distance between the principal surface 102 and the surface of the waveguide member 106b facing the semiconductor substrate 101 may be less than the distance between the principal surface 102 and the surface of the conductive member, included in the second interconnect layer 112b, facing the semiconductor substrate 101 and may be greater than the distance d4 between the principal surface 102 and the opposite surface of the conductive member, included in the first interconnect layer 112a, from the semiconductor substrate 101.

In this embodiment, the surface of the waveguide member 106a facing the semiconductor substrate 101 is disposed apart from the principal surface 102 by a predetermined distance. The waveguide members 106a and 106b may, however, be in contact with the semiconductor substrate 101.

An intralayer lens 114 converges light traveling toward the semiconductor substrate 101 on the photoelectric conversion unit 103a or the waveguide member 106a. The intralayer lens 114 is disposed on an opposite side of the waveguide member 106a from the semiconductor substrate 101. The intralayer lens 114 is disposed in association with the photoelectric conversion unit 103a in the light-receiving area. In this embodiment, the intralayer lens 114 comprises a silicon nitride film. The placement of the intralayer lens 114 is not necessarily needed. Although not illustrated in FIG. 1, a color filter and a top lens may be arranged on an opposite side of the intralayer lens 114 from the semiconductor substrate 101.

A method of making the solid-state image pickup device 100 according to this embodiment will now be described with reference to FIGS. 2A to 3C. In FIGS. 2A to 3C, components having the same functions as those in FIG. 1 are designated by the same reference numerals and detailed description thereof is omitted.

Figure 2A:
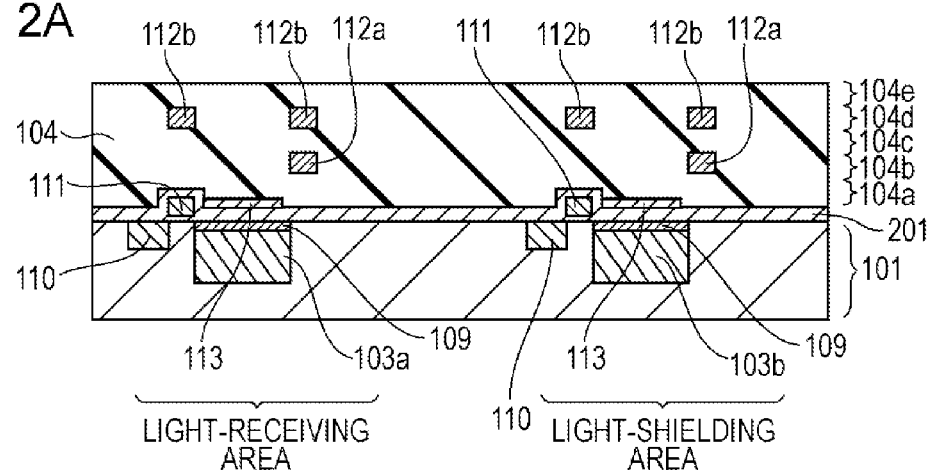
FIG. 2A is a diagram illustrating a method of making the solid-state image pickup device according to the first embodiment.

FIG. 2A illustrates a step of forming the semiconductor regions in the semiconductor substrate 101 and forming a gate electrode 111, the insulator 104, the etching stoppers 113, and the first and second interconnect layers 112a and 112b above the semiconductor layer 101. In this step, the photoelectric conversion units 103a and 103b and the FD regions 110 are formed in the semiconductor substrate 101 such that the portions and the regions are arranged in the vicinity of the principal surface 102. At this time, source and drain regions of other transistors in pixel portions may be formed. The gate electrodes 111 are then formed. At this time, gate electrodes of the other transistors in the pixel portions may be formed.

After that, a protective layer 201 is formed on the principal surface 102 adjacent to which the photoelectric conversion units 103a and 103b are arranged. For example, the protective layer 201 is a silicon nitride film. The protective layer 201 may be composed of a plurality of layers including a silicon nitride film and a silicon oxide film. The protective layer 201 may have a function of reducing damage to be applied to the photoelectric conversion units in a subsequent step. Moreover, the protective layer 201 may have an antireflection function. The etching stoppers 113 are formed on an opposite surface of the protective layer 201 from the semiconductor substrate 101. The areas of the etching stoppers 113 may be greater than the areas of the respective bottoms of the holes 105a and 105b to be formed later. Furthermore, the etching stoppers 113 may be omitted in an area other than the bottoms of the holes 105a and 105b. Note that formation of the protective layer 201 and the etching stoppers 113 is not necessarily needed.

The insulator 104, the first interconnect layer 112a, and the second interconnect layer 112b are then formed. In this embodiment, the first and second interconnect layers 112a and 112b are formed using a damascene process. A case where the insulator 104 is composed of a plurality of insulating interlayers 104a to 104e will be described. For the sake of convenience, the insulating interlayers will be called first to fifth insulating interlayers 104a to 104e in order from the interlayer closest to the semiconductor substrate 101.

The first insulating interlayer 104a is formed so as to fully cover the light-receiving area and the light-shielding area. An opposite surface of the first insulating interlayer 104a from the semiconductor substrate 101 may be planarized as necessary. Through-holes (not illustrated) are formed in the first insulating interlayer 104a. In the through-holes, plugs electrically connecting the conductive member in the first interconnect layer 112a to the semiconductor regions in the semiconductor substrate 101 are arranged.

Then, the second insulating interlayer 104b is formed on an opposite side of the first insulating interlayer 104a from the semiconductor substrate 101. In the second insulating interlayer 104b, portions corresponding to regions where the conductive member in the first interconnect layer 112a is to be disposed are removed by etching. After that, a metal film, serving as the first interconnect layer 112a, is formed so as to fully cover the light-receiving area and the light-shielding area. Then, the metal film is removed by a method, such as CMP, such that the second insulating interlayer 104b is exposed. The conductive member which serves as the interconnects in the first interconnect layer 112a is disposed in a predetermined pattern in the above-described manner.

The third insulating interlayer 104c and the fourth insulating interlayer 104d are formed so as to fully cover the light-receiving area and the light-shielding area. In the fourth insulating interlayer 104d, portions corresponding to regions where the conductive member in the second interconnect layer 112b is to be disposed are removed by etching. In the third insulating interlayer 104c, portions corresponding to regions where plugs electrically connecting the conductive member in the first interconnect layer 112a to the conductive member in the second interconnect layer 112b are to be arranged are removed by etching. After that, a metal film, serving as the second interconnect layer 112b and the plugs, is formed so as to fully cover the light-receiving area and the light-shielding area. Then, the metal film is removed by a method, such as CMP, such that the fourth insulating interlayer 104d is exposed. An interconnect pattern in the second interconnect layer 112b and a plug pattern are obtained in the above-described manner. After formation of the third and fourth insulating interlayers 104c and 104d, the portions corresponding to the regions where the plugs electrically connecting the conductive member in the first interconnect layer 112a to that in the second interconnect layer 112b are to be arranged may be removed by etching.

Finally, the fifth insulating interlayer 104e is formed so as to fully cover the light-receiving area and the light-shielding area. An opposite surface of the fifth insulating interlayer 104e from the semiconductor substrate 101 may be planarized as necessary.

Furthermore, an etching stopping film, an antireflection metal film, or a film having functions of both of those films may be disposed between the adjacent insulating interlayers. Specifically, in the case where the insulator 104 is a silicon oxide film, a silicon nitride film serves as an antireflection metal film.

The first and second interconnect layers 112a and 112b may be formed by a method other than a damascene process. A method other than a damascene process will now be described. After formation of the first insulating interlayer 104a, the metal film, serving as the first interconnect layer 112a, is formed so as to fully cover the light-receiving area and the light-shielding area. In the metal film, portions other than the regions where the conductive member in the first interconnect layer 112a is disposed are removed by etching.

Thus, the interconnect pattern of the first interconnect layer 112a is obtained. After that, the second insulating interlayer 104b and the third insulating interlayer 104c are formed and the second interconnect layer 112b is similarly formed. After the second interconnect layer 112b is formed, the fourth insulating interlayer 104d and the fifth insulating interlayer 104e are formed. Opposite surfaces of the third and fifth insulating interlayers 104c and 104e from the semiconductor substrate 101 are planarized as necessary.

As regards the formation of the insulator 104, the insulator 104 may be formed in a region associated with the photoelectric conversion unit 103a and a region associated with the photoelectric conversion unit 103b at the same time. The reason is that the insulator 104 serves as the side walls of the holes 105a and 105b. The difference in noise between the photoelectric conversion units 103a and 103b caused by different steps of forming the insulator 104 is, however, small. Accordingly, the insulator 104 may be formed in the region associated with the photoelectric conversion unit 103a and the region associated with the photoelectric conversion unit 103b by different steps.

An interconnect structure of the first and second interconnect layers 112a and 112b in the light-receiving area may coincide with that in the light-shielding area. In this arrangement, the parasitic capacitance between the interconnects in the light-receiving area can be substantially equal to that in the light-shielding area.

Figure 2B:
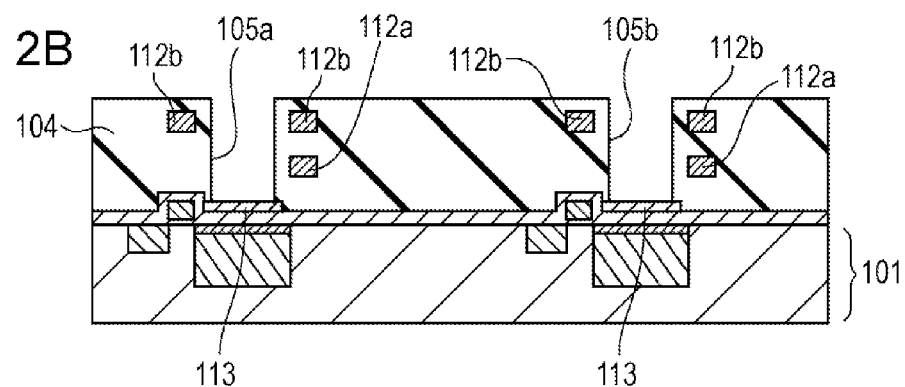
FIG. 2B is a diagram illustrating the method of making the solid-state image pickup device according to the first embodiment.

FIG. 2B illustrates forming the holes 105a and 105b in the insulator 104. An etching mask pattern (not illustrated) is disposed on an opposite side of the insulator 104 from the semiconductor substrate 101. The etching mask pattern covers a region other than the regions where the holes 105a and 105b are to be arranged. In other words, the etching mask pattern has an opening corresponding to the region where the hole 105a is to be disposed and another opening corresponding to the region where the hole 105b is to be disposed. The etching mask pattern is a photoresist patterned by, for example, photolithography and development.

The insulator 104 is then etched using the etching mask pattern as a mask. Thus, the holes 105a and 105b are simultaneously formed. After etching of the insulator 104, the etching mask pattern is removed.

In the case where the etching stoppers 113 are arranged, etching can be performed in FIG. 2B such that the etching stoppers 113 are exposed. The etching stoppers 113 may have an etching rate lower than that of the insulator 104 under etching conditions for etching the insulator 104. In the case where the insulator 104 is a silicon oxide film, the etching stoppers 113 may comprise a silicon nitride film or a silicon oxynitride film. The etching stoppers 113 may be exposed by a plurality of etching processes under different conditions.

A feature of one aspect of this embodiment is that the insulator 104 positioned in the region where the hole 105a is to be formed and the insulator 104 positioned in the region where the hole 105b is to be formed are simultaneously etched. Accordingly, the etching mask pattern used for etching has an opening corresponding to the region where the hole 105a is to be disposed and another opening corresponding to the region where the hole 105b is to be disposed. Etching the insulator 104 using such an etching mask pattern allows the holes 105a and 105b to be simultaneously formed. In the above-described step, the holes 105a and 105b having substantially the same shape can be formed, except for an influence of, for example, unevenness in the plane of the semiconductor substrate 101. Furthermore, damage caused by etching to the photoelectric conversion unit 103a may substantially coincide with that to the photoelectric conversion unit 103b.

Figure 2C:
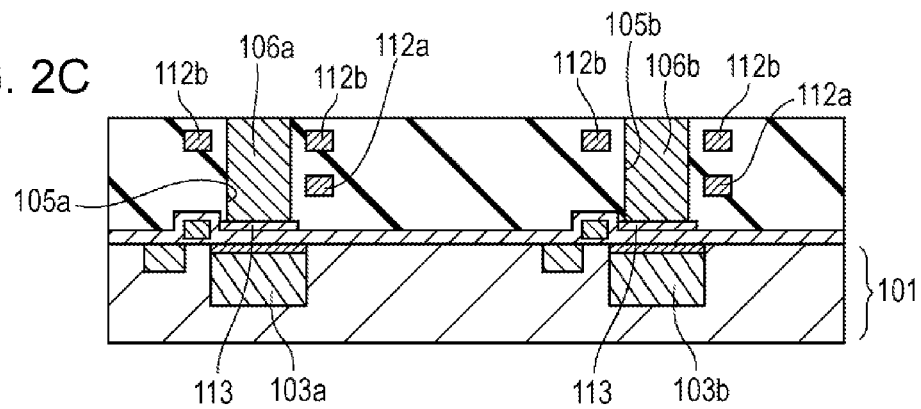
FIG. 2C is a diagram illustrating the method of making the solid-state image pickup device according to the first embodiment.

FIG. 2C illustrates forming the waveguide members 106a and 106b in the holes 105a and 105b, respectively. The material of the waveguide members 106a and 106b is deposited so as to fully cover the light-receiving area and the light-shielding area. The deposition of the material of the waveguide members 106a and 106b can be achieved by film formation by chemical vapor deposition (CVD) or sputtering, or application of an organic material, such as polyimide polymer. After that, the material of the waveguide members 106a and 106b protruding from the holes 105a and 105b is removed as necessary. The removal of the material of the waveguide members 106a and 106b protruding from the holes 105a and 105b is not necessarily needed. Each of the waveguide members 106a and 106b may be formed such that the opposite end of the waveguide member from the semiconductor substrate 101 is farther from the principal surface 102 of the semiconductor substrate 101 than the second interconnect layer 112b. In the case where the insulator 104 is etched in the step illustrated in FIG. 2B such that the etching stoppers 113 are exposed, the waveguide members 106a and 106b are arranged in contact with the respective etching stoppers 113.

The waveguide members 106a and 106b may be formed by multiple depositions of the same material. Furthermore, the waveguide members 106a and 106b can be formed by sequential depositions of different materials. For example, a silicon nitride film may be formed and an organic material having high filling ability may then be formed, thus forming the waveguide members 106a and 106b.

As regards the material of the waveguide members 106a and 106b, any material having a higher refractive index than that of the insulator 104 may be used. In the case where the insulator 104 is a silicon oxide film, examples of the material of the waveguide members 106a and 106b include a silicon nitride film and a polyimide organic material. In this embodiment, the refractive index of the silicon nitride film is approximately 2.0. The refractive index of the surrounding silicon oxide film is approximately 1.4. Accordingly, light incident on the interface between the insulator 104 and each of the waveguide members 106a and 106b is reflected according to Snell's law. Consequently, the light can be trapped in the waveguide members 106a and 106b. The content of hydrogen in the silicon nitride film can be increased, so that dangling bonds from the substrate can be terminated due to the effect of hydrogen supply. Consequently, noise, such as a white defect, can be reduced. The refractive index of the polyimide organic material is approximately 1.7. The filling ability of the polyimide organic material is higher than that of the silicon nitride film. The material of the waveguide members 106a and 106b may be appropriately chosen in consideration of the balance between optical characteristics, such as the difference between refractive indices, and benefits of making steps.

In FIG. 2C, a feature of this embodiment is that the waveguide members 106a and 106b are simultaneously formed. When the material of the waveguide members 106a and 106b is deposited in one of the holes 105a and 105b, the material is deposited in the other hole. In the above-described step, the waveguide members 106a and 106b having substantially the same shape can be formed, except for an influence of, for example, unevenness in the plane of the semiconductor substrate 101.

Figure 3A:
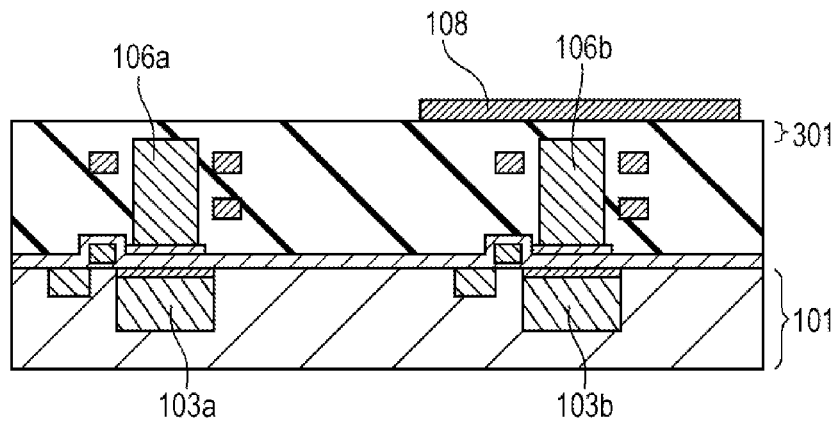
FIG. 3A is a diagram illustrating the method of making the solid-state image pickup device according to the first embodiment.

FIG. 3A illustrates forming a first planarization film 301 and the light-shielding member 108. The first planarization film 301 is formed on the opposite side of the waveguide members 106a and 106b from the semiconductor substrate 101. The first planarization film 301 is, for example, a silicon oxide film. An opposite surface of the first planarization film 301 from the semiconductor substrate 101 is then planarized by CMP. The method of planarization is not limited to CMP. A known method, such as etching or polishing, can be used. In the case where the surface, where the first planarization film 301 is to be formed, is planarized before formation of the film 301, planarization after formation of the film 301 is not necessarily needed. The first planarization film 301 may be omitted.

The light-shielding member 108 is formed on an opposite side of the first planarization film 301 from the semiconductor substrate 101. The light-shielding member 108 is disposed in association with the photoelectric conversion unit 103b in the light-shielding area. The light-shielding member 108 reflects or absorbs light traveling toward the photoelectric conversion unit 103b. Accordingly, light-reflective metal or a light-absorbing organic material is suitable for the material of the light-shielding member 108. In this embodiment, the light-shielding member 108 comprises aluminum. As regards a method of forming the light-shielding member 108, the method of making the first interconnect layer 112a or the second interconnect layer 112b may be appropriately used. The light-shielding member 108 may be included in the third interconnect layer. Specifically, in the step of forming the light-shielding member 108, the conductive member which serves as pads or interconnects for the peripheral circuits can be simultaneously formed. The light-shielding member 108 may serve as an interconnect.

Figure 3B:
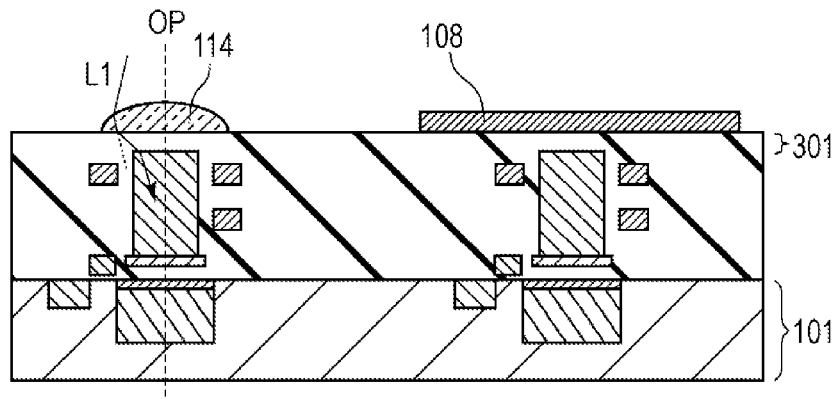
FIG. 3B is a diagram illustrating the method of making the solid-state image pickup device according to the first embodiment.

FIG. 3B illustrates forming the intralayer lens 114. The intralayer lens 114 is formed on the opposite side of the first planarization film 301 from the semiconductor substrate 101. The intralayer lens 114 is disposed in association with the photoelectric conversion unit 103a in the light-receiving area. The intralayer lens 114 comprises, for example, a silicon nitride film. As regards a method of making the intralayer lens 114, a known method can be used.

In this embodiment, as illustrated in FIG. 3A, the surface of the light-shielding member 108 facing the semiconductor substrate 101 is in contact with the first planarization film 301. As illustrated in FIG. 3B, the surface of the intralayer lens 114 facing the semiconductor substrate 101 is in contact with the first planarization film 301. In other words, the light-shielding member 108 and the intralayer lens 114 are arranged in contact with the same film (e.g., the first planarization film 301), the opposite surface of the film from the semiconductor substrate 101 being planarized. In this arrangement, when a new film is formed so as to cover the light-shielding member 108 and the intralayer lens 114, the difference in level between the light-receiving area and the light-shielding area can be reduced.

A refractive index of the first planarization film 301 may be lower than that of the intralayer lens 114. In this embodiment, the refractive index of the silicon nitride film which serves as the intralayer lens 114 is approximately 2.0 and that of the silicon oxide film which serves as the first planarization film 301 is approximately 1.46. In the above relationship between the refractive indices, sensitivity to oblique incident light can be increased. The reason is as follows. Oblique incident light (indicated at an arrow L1) is not fully converged by the intralayer lens 114, so that the light does not enter the waveguide member 106a in some cases. In FIG. 3B, a dotted line indicates the optical path of the light in this case. Since the member having a lower refractive index than that of the intralayer lens 114 is disposed between the intralayer lens 114 and the waveguide member 106a, however, the oblique incident light is converged by the intralayer lens 114 and is then refracted to an optical axis OP. In FIG. 3B, a broken line indicates the optical axis OP. Since the oblique incident light enters the waveguide member 106a as described above, sensitivity to the oblique incident light can be increased.

Figure 3C:
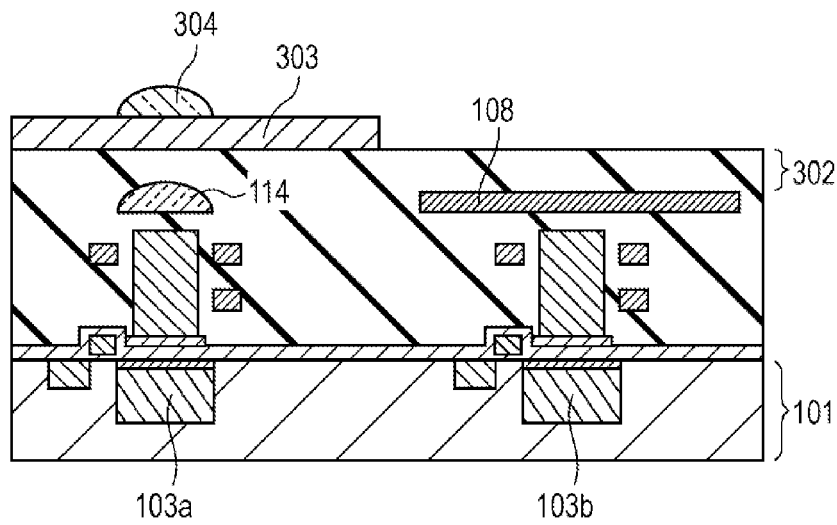
FIG. 3C is a diagram illustrating the method of making the solid-state image pickup device according to the first embodiment.

FIG. 3C illustrates forming a color filter 303 and a microlens 304. After formation of the light-shielding member 108 and the intralayer lens 114, a second planarization film 302 is formed so as to cover the light-shielding member 108 and the intralayer lens 114. The second planarization film 302 is an insulator. The second planarization film 302 is, for example, a silicon oxide film. An opposite surface of the second planarization film 302 from the semiconductor substrate 101 is planarized as necessary. After that, the color filter 303 and the microlens 304 are formed in a region associated with the photoelectric conversion unit 103a in the light-receiving area. The color filter 303 and the microlens 304 are arranged as necessary. In this embodiment, in the second planarization film 302, any one of a portion associated with the first photoelectric conversion unit 103a and another portion associated with the second photoelectric conversion unit 103b is not removed.

In this embodiment, in the step illustrated in FIG. 2B, the insulator 104 is etched in both the light-receiving area and the light-shielding area simultaneously. As long as etching the insulator 104 is performed in both the light-receiving area and the light-shielding area simultaneously, the holes 105a and 105b can be formed at the same time. Specifically, the step of etching the insulator 104 using the etching mask having the opening corresponding to the region where the hole 105a is to be formed and the other opening corresponding to the region where the hole 105b is to be formed is a step of simultaneously forming the holes 105a and 105b.

If the etching mask has only the opening corresponding to the region where the hole 105a is to be formed, only the portion of the insulator 104 corresponding to the hole 105a will be etched in the subsequent etching step. In this step, the holes 105a and 105b are not simultaneously formed.

In the step illustrated in FIG. 2C, the material of the waveguide members 106a and 106b is deposited in both the holes 105a and 105b simultaneously. As long as the material of the waveguide members 106a and 106b is deposited both in the holes 105a and 105b simultaneously, the waveguide members 106a and 106b can be formed at the same time. All of the steps from the step of forming the semiconductor regions in the semiconductor substrate 101 to the step of forming the waveguide members 106a and 106b may be simultaneously performed in both the light-receiving area and the light-shielding area.

If a step of forming only one of the waveguide members 106a and 106b is included, the waveguide members 106a and 106b are not simultaneously formed.

After formation of the light-shielding member 108, the second planarization film 302 is formed. In this embodiment, in the second planarization film 302, only one of a portion associated with the first photoelectric conversion unit 103a and another portion associated with the second photoelectric conversion unit 103b is not removed.

Figure 4A:
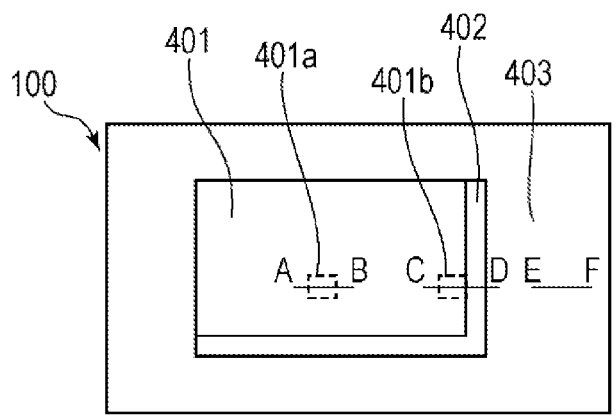
FIG. 4A is a plan view of a schematic structure of the solid-state image pickup device according to the first embodiment.
Figure 4B:
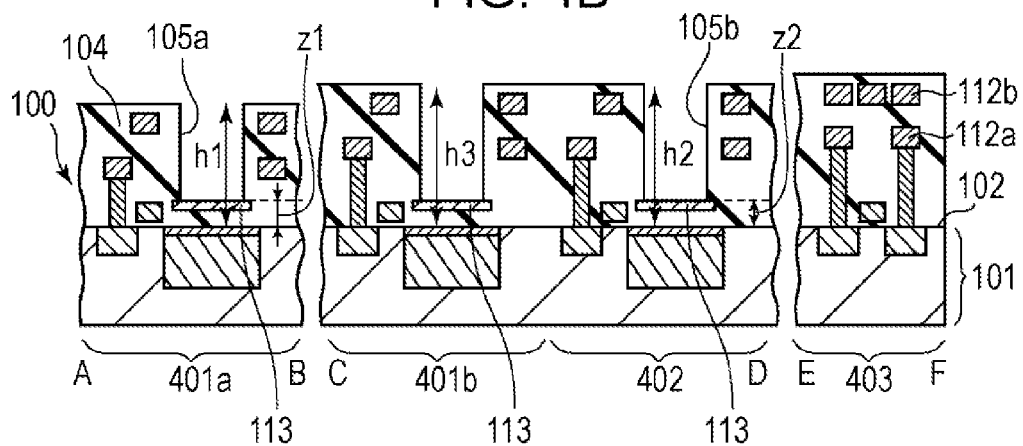
FIG. 4B is a cross-sectional view of a schematic structure of the solid-state image pickup device according to the first embodiment.
Figure 4C:
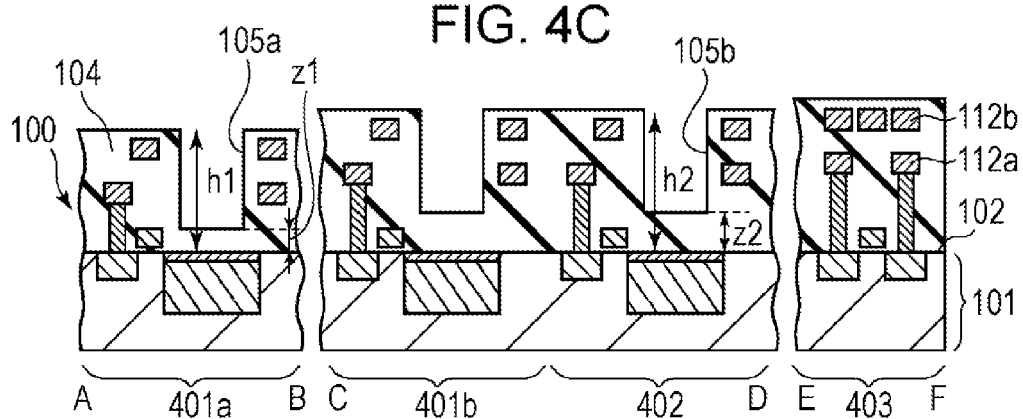
FIG. 4C is a cross-sectional view of a schematic structure of the solid-state image pickup device according to the first embodiment.

Benefits of the arrangement of the etching stoppers 113 in the step illustrated in FIG. 2B will now be described with reference to FIGS. 4A to 4C. In FIGS. 4A to 4C, components having the same functions as those in FIGS. 1 to 3C are designated by the same reference numerals and detailed description thereof is omitted.

FIG. 4A is a plan view of a schematic structure of the solid-state image pickup device 100 according to this embodiment. A light-receiving area 401, a light-shielding area 402, and a peripheral circuit area 403 are illustrated. A plurality of pixels each including the photoelectric conversion unit are arranged in the light-receiving area 401 and the light-shielding area 402. For example, an array of 1920×1080 pixels can be disposed in the light-receiving area 401. The photoelectric conversion units arranged in the light-shielding area 402 are shielded from light. The light-shielding area 402 is positioned between the light-receiving area 401 and the peripheral circuit area 403. In the peripheral circuit area 403, circuits used for operations of the solid-state image pickup device 100 are arranged. In addition, signal processing circuits for processing signals from the photoelectric conversion units are arranged in the peripheral circuit area 403. The circuits arranged in the peripheral circuit area 403 include, for example, a vertical shift register, a horizontal shift register, an amplifier, an analog-to-digital converter (ADC), and a memory. The amplifier, the ADC, and the memory may be arranged for each row of the photoelectric conversion units arranged in the array.

FIGS. 4B and 4C are cross-sectional views of schematic structures of the solid-state image pickup device 100 taken along the lines AB, CD, and EF in FIG. 4A. FIG. 4B illustrates the cross sections, where the etching stoppers 113 are arranged, in the step of FIG. 2B. FIG. 4C illustrates the cross sections, where the etching stoppers 113 are not arranged, in the step of FIG. 2B. The cross section taken along the line AB includes a pixel 401a disposed in the light-receiving area 401. The cross section taken along the line CD includes a pixel 410b disposed in the light-receiving area 401 and a pixel disposed in the light-shielding area 402. The pixel 401b is positioned farther from the center of the light-receiving area 401 than the pixel 401a. The pixel 401b is positioned adjacent to the pixel disposed in the light-shielding area 402. The cross section taken along the line EF corresponds to the peripheral circuit area 403.

In this embodiment, the step of forming the first interconnect layer 112a and the second interconnect layer 112b includes planarizing. In the planarizing, however, the difference in level between the insulator 104 in the light-receiving area 401 and that in the peripheral circuit area 403 may occur. This is caused by, for example, the difference in a density of arranged plugs between the light-receiving area 401 and the peripheral circuit area 403. The density of plugs means the number of plugs per unit area in plane. For example, the light-receiving area 401 in which the density of plugs is high may be recessed relative to the peripheral circuit area 403 by planarization. The difference in level may be caused due to, for example, the difference in the density of interconnects between these areas. Accordingly, the difference in level between the insulator 104 in the light-receiving area 401 and that in the light-shielding area 402 near the peripheral circuit area 403 may also be caused.

In FIGS. 4B and 4C, h1 denotes the distance between the principal surface 102 of the semiconductor substrate 101 and an opposite surface of the insulator 104 from the semiconductor substrate 101 in the pixel 401a and h2 denotes the distance between the principal surface 102 of the semiconductor substrate 101 and the opposite surface of the insulator 104 from the semiconductor substrate 101 in the light-shielding area 402. The distance h1 differs from the distance h2 as illustrated in FIGS. 4B and 4C. The difference in level does not tend to occur in a pixel positioned in close proximity to a pixel in the light-shielding area 402. The reason is that the height of the solid-state image pickup device 100 gradually varies from the peripheral circuit area 403 to the center of the light-receiving area 401. Accordingly, the distance, indicated at h3, between the principal surface 102 of the semiconductor substrate 101 and the opposite surface of the insulator 104 from the semiconductor substrate 101 in, for example, the pixel 401b adjacent to the pixel included in the light-shielding area 402 is approximately equal to the distance h2.

In the case where the etching stoppers 113 are arranged as illustrated in FIG. 4B, the insulator 104 may be etched in the step of FIG. 2B such that the etching stoppers 113 are exposed. Since the etching rate of the etching stoppers 113 is low, etching hardly proceeds after exposure of the etching stoppers 113. Since the etching stoppers 113 serve as the respective bottoms of the holes 105a and 105b, the distance between the principal surface 102 of the semiconductor substrate 101 and the bottom of the hole 105a in the pixel 401a is substantially equal to the distance between the principal surface 102 of the semiconductor substrate 101 and the bottom of the hole 105b in the light-shielding area 402. In FIGS. 4B and 4C, z1 denotes the distance between the principal surface 102 of the semiconductor substrate 101 and the bottom of the hole 105a in the light-receiving area 401 and z2 denotes the distance between the principal surface 102 of the semiconductor substrate 101 and the bottom of the hole 105b in the light-shielding area 402. In FIG. 4B, the distance z1 is approximately equal to the distance z2.

In the case where the etching stoppers 113 are not arranged, the insulator 104 is etched by an amount depending on etching time. Accordingly, the distance z1 differs from the distance z2 as illustrated in FIG. 4C. The reason is that the above-described difference reflects the original unevenness of the insulator 104.

As described above, the arrangement of the etching stoppers 113 allows the distance z1 (the level of the bottom of the hole 105a) in the light-receiving area 401 and the distance z2 (the level of the bottom of the hole 105b) in the light-shielding area 402 to be approximately equal to each other. Consequently, the difference between noise caused in the photoelectric conversion unit in the light-receiving area 401 and that in the light-shielding area 402 can be reduced, so that image quality can be increased.

This embodiment has been described with respect to the case where the refractive index of the waveguide members 106 is higher than that of the insulator 104. It is not always necessary that the refractive index of the waveguide members 106 be higher than that of the insulator 104. For example, a light-reflective member may be attached to the side wall of each hole 105 and the waveguide member 106 may then be disposed in the hole 106.

Second Embodiment

Figure 5A:
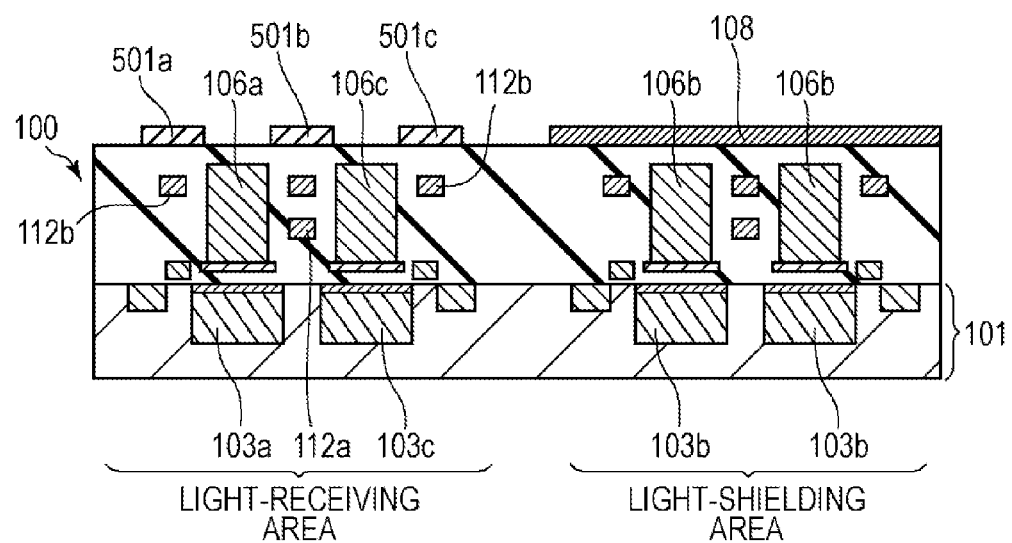
FIG. 5A is a cross-sectional view of a schematic structure of a solid-state image pickup device according to a second embodiment.
Figure 5B:
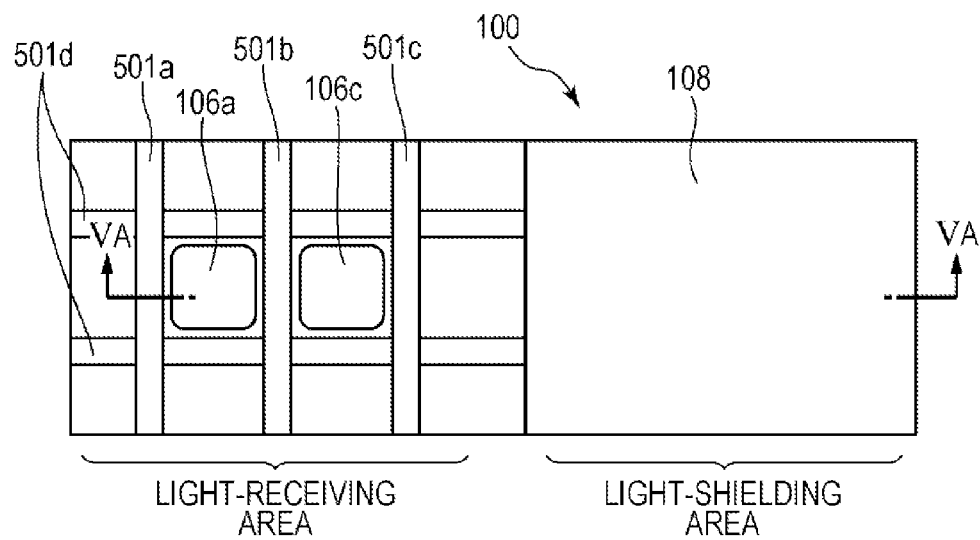
FIG. 5B is a plan view of the schematic structure of the solid-state image pickup device according to the second embodiment.

A solid-state image pickup device according to another embodiment of the present invention will now be described with reference to the drawings. FIG. 5A is a cross-sectional view of a schematic structure of a solid-state image pickup device 100 according to a second embodiment. FIG. 5B is a plan view of the schematic structure of the solid-state image pickup device 100 according to the second embodiment. Components having the same functions as those in FIGS. 1 to 4C are designated by the same reference numerals and detailed description is omitted.

A feature of this embodiment is that light-shielding members 501a to 501c are arranged such that each member is disposed between the adjacent photoelectric conversion units arranged in the light-receiving area. The second embodiment may provide the same structure as that in the first embodiment, except for this arrangement.

As illustrated in FIG. 5A, a photoelectric conversion unit 103a and a photoelectric conversion unit 103c are arranged in the light-receiving area. A waveguide member 106a is disposed in association with the photoelectric conversion unit 103a. A waveguide member 106c is disposed in association with the photoelectric conversion unit 103c. For the sake of convenience, the photoelectric conversion unit 103c and the waveguide member 106c are designated by the reference numerals different from those of the photoelectric conversion unit 103a and the waveguide member 106a. The photoelectric conversion units 103a and 103c, however, have the same function. Furthermore, the waveguide members 106a and 106c have the same function. Accordingly, the description of the photoelectric conversion unit 103a and that of the waveguide member 106a in the first embodiment can be appropriately applied to the photoelectric conversion unit 103c and the waveguide member 106c.

The light-shielding member 501b is disposed between the waveguide member 106a disposed in association with the photoelectric conversion unit 103a and the waveguide member 106c disposed in association with the photoelectric conversion unit 103c. The reason why the light-shielding member 501b is disposed between the waveguide members 106a and 106c is as follows. When the waveguide members 106a and 106b and the light-shielding member 501b are projected on the same plane, the light-shielding member 501b is projected between a region where the waveguide member 106a is projected and a region where the waveguide member 106c is projected. The light-shielding member 501a is disposed between the waveguide member 106a and a waveguide member associated with a photoelectric conversion unit of another pixel adjacent to the photoelectric conversion unit 103a. The light-shielding member 501c is disposed between the waveguide member 106c and a waveguide member associated with a photoelectric conversion unit of another pixel adjacent to the photoelectric conversion unit 103c.

As regards a material of the light-shielding members 501a to 501c, the same material as that of the light-shielding member 108 can be appropriately used. The material of the light-shielding members 501a to 501c may be the same as that of the light-shielding member 108. In this embodiment, the light-shielding members 501a to 501c comprise aluminum. The light-shielding members 501a to 501c are arranged farther from the semiconductor substrate 101 than the waveguide members 106a and 106c. The light-shielding members 501a to 501c may be arranged in the same interconnect layer as that including the light-shielding member 108. Thus, the light-shielding members 501a to 501c can be formed without increase of the number of interconnect forming steps. In this embodiment, the light-shielding member 108 and the light-shielding members 501a to 501c are arranged in a third interconnect layer.

FIG. 5B is a plan view of the schematic structure of the solid-state image pickup device 100 according to this embodiment. The cross section taken along the line VA-VA in FIG. 5B is illustrated in FIG. 5A. Referring to FIG. 5B, the light-shielding member 501b is disposed between the waveguide member 106a associated with the photoelectric conversion unit 103a and the waveguide member 106c associated with the photoelectric conversion unit 103c. The photoelectric conversion unit 103a may be surrounded by the light-shielding members 501a and 501b and light-shielding members 501d. In other words, the light-shielding members may be arranged in a lattice pattern in the light-receiving area and each photoelectric conversion unit may be disposed in a region surrounded by the light-shielding members. The arrangement is not limited to this one. The light-shielding member 501b may be disposed in only the region between the photoelectric conversion units 103a and 103c. The light-shielding member 108 may be disposed so as to fully cover the light-shielding area. Thus, the quantity of light entering photoelectric conversion units 103b arranged in the light-shielding area can be reduced.

The solid-state image pickup device 100 according to this embodiment may further include an intralayer lens 114, a color filter 303, and a microlens 304.

A method of forming the above-described light-shielding members 501a to 501c will now be described. The method includes the same steps as those illustrated in FIGS. 2A to 2C in the first embodiment. In the step illustrated in FIG. 3A, when the light-shielding member 108 is formed, the light-shielding members 501a to 501c included in the same interconnect layer are formed.

In this embodiment, as described above, the light-shielding member 501b is disposed between the waveguide members 106a and 106c in the light-receiving area. Thus, the quantity of light entering a region excluding the waveguide members 106a and 106c can be reduced. As regards light entering a region excluding the waveguide members 106a and 106c, light is likely to enter a region excluding the photoelectric conversion units in the semiconductor substrate 101. Accordingly, the light entering the region excluding the waveguide members 106a and 106c causes noise, such as color mixture. This embodiment, therefore, has a benefit in that noise can be further reduced in addition to the benefits of the first embodiment.

Third Embodiment

A solid-state image pickup device according to a third embodiment of the present invention will now be described with reference to FIG. 6. FIG. 6 is a cross-sectional view of a schematic structure of the solid-state image pickup device, indicated at 100, according to this embodiment. Components having the same functions as those in FIGS. 1 to 5B are designated by the same reference numerals and detailed description thereof is omitted.

A feature of this embodiment is the structure of an intralayer lens 601 disposed on an opposite side of a waveguide member 106a from a semiconductor substrate 101. The intralayer lens 114 in the first embodiment is a convex lens that protrudes far away from the semiconductor substrate 101. Hereinafter, such a lens will be referred to as an "upwardly protruding lens". In this embodiment, the intralayer lens 601 is a convex lens that protrudes toward the semiconductor substrate 101. Hereinafter, such a lens will be referred to as a "downwardly protruding lens".

A method of forming the intralayer lens 601, serving as a downwardly protruding lens, will now be described. The method includes the same steps as those illustrated in FIGS. 2A to 2C in the first embodiment. In the step illustrated in FIG. 3A, when a light-shielding member 108 is formed, light-shielding members 501a to 501c included in the same interconnect layer are formed. At this time, the light-shielding members 501a and 501c are arranged in a grid pattern. After that, a base member 602 is formed. The base member 602 is disposed so as to cover the light-shielding members 501a to 501c. Accordingly, irregularities are caused on the base member 602 by the difference in level between regions where the light-shielding members 501a to 501c are arranged and regions where the light-shielding members 501a to 501c are not arranged. Since the light-shielding members 501a to 501c are arranged in a grid pattern so as to surround each photoelectric conversion unit, a depression is disposed in each region, associated with the photoelectric conversion unit, in the base member 602. A material having a higher refractive index than that of the base member 602 is then deposited on an opposite side of the base member 602 from the semiconductor substrate 101. The intralayer lens 601, serving as a downwardly protruding lens, can be formed by the above-described steps.

After deposition of the material of the intralayer lens 601, an opposite surface of the intralayer lens 601 from the semiconductor substrate 101 may be planarized as necessary. A color filter 303 and microlenses 304 may be further formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026352 filed Feb. 9, 2011, which is hereby incorporated by reference herein in its entirety.

What is claimed is:

1. A solid-state image pickup device comprising:
a semiconductor substrate;
a first photoelectric conversion unit and a second photoelectric conversion unit arranged in the semiconductor substrate along a principal surface of the semiconductor substrate;
a first member disposed on the semiconductor substrate, the first member being an insulator;
a second member disposed on the semiconductor so as to be surrounded or sandwiched by the first member in a direction along the principal surface and to overlap the first photoelectric conversion unit, the second member forming, with the first member, a structure for an optical waveguide;
a third member disposed on the semiconductor substrate so as to be surrounded or sandwiched by the first member in a direction along the principal surface and to overlap the second photoelectric conversion unit, the third member forming, with the first member, a structure for an optical waveguide;
a plurality of interconnect layers arranged on the semiconductor substrate;
a first film disposed on the semiconductor substrate, the first film having a first portion and a second portion, the second member being positioned between the first portion of the first film and the first photoelectric conversion unit in a direction intersecting the principal surface, and the third member being positioned between the second portion of the first film and the second photoelectric conversion unit in a direction intersecting the principal surface;
a light-shielding member disposed on an opposite side of the third member from the semiconductor substrate, the third member being positioned between the light-shielding member and the second photoelectric conversion unit in a direction intersecting the principal surface;
a first lens disposed on the semiconductor substrate in association with the first photoelectric conversion unit; and
a second lens disposed on the semiconductor substrate in association with the first photoelectric conversion unit, wherein
the second lens is positioned between the first lens and the second member, and the first portion of the first film is positioned between the second lens and the second member,
the second portion of the first film is positioned between the light-shielding member and the third member in a direction intersecting the principal surface,
a first distance between the principal surface of the semiconductor substrate and an opposite surface of the second member from the semiconductor substrate and a second distance between the principal surface of the semiconductor substrate and an opposite surface of the third member from the semiconductor substrate are less than a third distance between the principal surface of the semiconductor substrate and a surface of the light-shielding member facing the semiconductor substrate, and the first distance and the second distance are greater than a fourth distance between the principal surface of the semiconductor substrate and an opposite surface of a conductive member from the semiconductor substrate, the conductive member being included in a closest interconnect layer to the semiconductor substrate of the interconnect layers.

2. The device according to claim 1, wherein a material of the second member and a material of the third member are higher than a material of the first member, in at least one of a refractive index and a dielectric constant.

3. The device according to claim 1, wherein the first film is positioned in contact with the light-shielding member.

4. The device according to claim 1, further comprising:
a low refractive index member disposed between the second lens and the first portion of the first film, the low refractive index member having a lower refractive index than that of a material of the second lens and that of the second member.

5. The device according to claim 4, wherein the second lens is a convex lens protruding toward the semiconductor substrate.

6. The device according to claim 1, further comprising:
a color filter disposed in association with the first photoelectric conversion unit ;
a second film disposed between the color filter and the first film,
wherein the second film having one portion and another portion, the one portion of the second film is in association with the first photoelectric conversion unit, the another portion of the second film is in association with the second photoelectric conversion unit, wherein
the first portion of the first film is positioned between the one portion of the second film and the second member, and the light-shielding member is positioned between the second portion of the first film and the another portion of the second film.

7. The device according to claim 1, further comprising:
a high refractive index member disposed on the opposite side of the second and third members from the semiconductor substrate;
a low refractive index member disposed between the high refractive index member and the second member, the low refractive index member having a lower refractive index than that of a material of the high refractive index member,
wherein the low refractive index member is positioned between the first portion of the first film and the high refractive index member, and extends between the light-shielding member and the high refractive index member.

8. The device according to claim 1, further comprising:
a third photoelectric conversion unit disposed adjacent to the first photoelectric conversion unit;
a fourth member disposed on the semiconductor substrate so as to be surrounded or sandwiched by the first member in a direction along the principal surface and to overlap the third photoelectric conversion unit, the fourth member forming, with the first member, a structure for an optical waveguide; and
a second light-shielding member, wherein the second light-shielding member is included in a same interconnect layer as that including the light-shielding member and is disposed on the first member disposed between the second and fourth members.

9. The device according to claim 1, wherein a material of the second member is the same as that of the third member.

10. The device according to claim 1, wherein the first film is a silicon oxide film.

11. The device according to claim 1, wherein an opposite surface of the first film from the semiconductor substrate is planar.

12. The device according to claim 1, wherein the first film has a lower refractive index than that of a material of the second lens.

13. The device according to claim 1, wherein the light-shielding member and the second lens are arranged in contact with the first film.

14. The device according to claim 1, further comprising:
a second film disposed on the semiconductor substrate, the second film having one portion and another portion, the one portion of the second film being in association with the first photoelectric conversion unit, the another portion of the second film being in association with the second photoelectric conversion unit,
wherein the light-shielding member is arranged between the another portion of the second film and the second portion of the first film, and the second lens is arranged between the one portion of the second film and the first portion of the first film.

15. The device according to claim 1, further comprising a color filter disposed between the first lens and the second lens in association with the first photoelectric conversion unit.

16. The device according to claim 1, wherein the second lens is a convex lens that protrudes away from the semiconductor substrate.

17. The device according to claim 1, wherein a material of the third member is silicon nitride containing hydrogen.

18. The device according to claim 1, wherein
the plurality of interconnect layers includes a first interconnect layer and a second interconnect layer, the first interconnect layer being positioned closer to the semiconductor substrate than the second interconnect layer,
the first member includes a first insulating layer positioned between the semiconductor substrate and the first interconnect layer, a second insulating layer positioned between the first interconnect layer and the second interconnect layer, and a third insulating layer positioned between the first film and the second interconnect layer, and
the second member and the third member are surrounded by the second insulating layer and the third insulating layer, in the direction along the principal surface.

19. A solid-state image pickup device comprising:
a semiconductor substrate;
a first photoelectric conversion unit and a second photoelectric conversion unit arranged in the semiconductor substrate along a principal surface of the semiconductor substrate;
a first member disposed on the semiconductor substrate, the first member being an insulator;
a second member disposed on the semiconductor substrate so as to be surrounded or sandwiched by the first member in a direction along the principal surface and to overlap the first photoelectric conversion unit, the second member forming, with the first member, a structure for an optical waveguide;

a third member disposed on the semiconductor substrate so as to be surrounded or sandwiched by the first member in a direction along the principal surface and to overlap the second photoelectric conversion unit, the third member forming, with the first member, a structure for an optical waveguide;

a fourth member disposed between the second member and the first photoelectric conversion unit;

a fifth member disposed between the third member and the second photoelectric conversion unit;

a plurality of interconnect layers arranged on the semiconductor substrate;

a first film disposed on the semiconductor substrate, the first film having a first portion and a second portion, the second member being positioned between the first portion of the first film and the first photoelectric conversion unit in a direction intersecting the principal surface, and the third member being positioned between the second portion of the first film and the second photoelectric conversion unit in a direction intersecting the principal surface; and a light-shielding member disposed on an opposite side of the third member from the semiconductor substrate, the third member being positioned between the light-shielding member and the second photoelectric conversion unit in a direction intersecting the principal surface;

wherein the second portion of the first film is positioned between the light-shielding member and the third member in a direction intersecting the principal surface, wherein a first distance between the principal surface of the semiconductor substrate and an opposite surface of the second member from the semiconductor substrate and a second distance between the principal surface of the semiconductor substrate and an opposite surface of the third member from the semiconductor substrate are less than a third distance between the principal surface of the semiconductor substrate and a surface of the light-shielding member facing the semiconductor substrate, wherein the first distance and the second distance are greater than a fourth distance between the principal surface of the semiconductor substrate and an opposite surface of a conductive member from the semiconductor substrate, the conductive member being included in a closest interconnect layer to the semiconductor substrate of the interconnect layers, wherein the fourth member is in contact with the second member, and a distance between the principal surface of the semiconductor substrate and a surface of the third member facing the semiconductor substrate is less than the distance between the principal surface of the semiconductor substrate and a surface of the closest interconnect layer facing the semiconductor substrate, and an area of the fourth member is greater than an area of the surface of the third member facing the semiconductor substrate, wherein the fifth member is in contact with the third member, and a distance between the principal surface of the semiconductor substrate and a surface of the third member facing the semiconductor substrate is less than the distance between the principal surface of the semiconductor substrate and a surface of the closest interconnect layer facing the semiconductor substrate, and an area of the fifth member is greater than an area of the surface of the third member facing the semiconductor substrate, wherein the plurality of interconnect layers includes a first interconnect layer and a second interconnect layer, the first interconnect layer being positioned closer to the semiconductor substrate than the second interconnect layer, wherein the first member includes a first insulating layer positioned between the semiconductor substrate and the first interconnect layer, a second insulating layer positioned between the first interconnect layer and the second interconnect layer, wherein the second member and the third member are surrounded by the first insulating layer and the second insulating layer in the direction along the principal surface, and wherein the fourth member and fifth member are made of silicon nitride.

* * * * *